United States Patent
Kim et al.

(10) Patent No.: US 11,968,913 B2
(45) Date of Patent: Apr. 23, 2024

(54) INTEGRATION OF SELECTOR ON CONFINED PHASE CHANGE MEMORY

(71) Applicant: INTERNATIONAL BUSINESS MACHINES CORPORATION, Armonk, NY (US)

(72) Inventors: Wanki Kim, Chappaqua, NY (US); Fabio Carta, Pleasantville, NY (US); Chung H. Lam, Peekskill, NY (US); Robert L. Bruce, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/876,237

(22) Filed: Jul. 28, 2022

(65) Prior Publication Data

US 2022/0367797 A1 Nov. 17, 2022

Related U.S. Application Data (62) Division of application No. 16/451,178, filed on Jun. 25, 2019, now Pat. No. 11,437,571.

(51) Int. Cl.
- *H10N 70/00* (2023.01)
- *H10B 63/00* (2023.01)
- *H10N 70/20* (2023.01)

(52) U.S. Cl.
CPC ......... *H10N 70/8265* (2023.02); *H10B 63/84* (2023.02); *H10N 70/023* (2023.02); *H10N 70/026* (2023.02); *H10N 70/063* (2023.02); *H10N 70/231* (2023.02); *H10N 70/841* (2023.02); *H10N 70/861* (2023.02); *H10N 70/882* (2023.02)

(58) Field of Classification Search
None
See application file for complete search history.

(56) References Cited

U.S. PATENT DOCUMENTS

| | | | |
|---|---|---|---|
| 7,714,315 | B2 | 5/2010 | Happ et al. |
| 8,097,487 | B2 | 1/2012 | Lung |
| 8,288,750 | B2 | 10/2012 | Shen et al. |

(Continued)

FOREIGN PATENT DOCUMENTS

CN 103682094 A 3/2014

OTHER PUBLICATIONS

Kim, "A Phase Change Memory Cell with Metallic Surfactant Layer as a Resistance Drift Stabilizer", IEEE International Electron Devices Meeting, Dec. 2013, 4 pages.

(Continued)

*Primary Examiner* — Telly D Green
(74) *Attorney, Agent, or Firm* — Tutunjian & Bitetto, P.C.; Daniel Morris (57) ABSTRACT

A method for fabricating a semiconductor device includes forming air gaps within respective dielectric layer portions to reduce thermal cross-talk between adjacent bits. Each of the dielectric portions is formed on a substrate each adjacent to sidewall liners formed on sidewalls of a phase change memory (PCM) layer. The method further includes forming a pillar including the sidewall liners and the PCM layer, and forming a selector layer on the pillar and the dielectric portions.

6 Claims, 6 Drawing Sheets

(56) References Cited

U.S. PATENT DOCUMENTS

| | | |
|---|---|---|
| 8,305,800 B2 | 11/2012 | Tu |
| 8,530,874 B1 | 9/2013 | Varesi |
| 8,722,455 B2 | 5/2014 | Song et al. |
| 9,029,828 B2 | 5/2015 | Oh |
| 9,484,534 B2 * | 11/2016 | Tang .................... H01L 23/528 |
| 10,892,413 B2 * | 1/2021 | Bruce .................. H10N 70/066 |
| 2013/0087756 A1 | 4/2013 | Joseph et al. |
| 2018/0205017 A1 | 7/2018 | Bruce et al. |
| 2018/0211703 A1 * | 7/2018 | Choi ..................... H10B 63/24 |

OTHER PUBLICATIONS

Lee, "Highly Scalable Non-Volatile and Ultra-Low-Power Phase-Change Nanowire Memory", Nature Nanotechnology, vol. 2, Oct. 2007, pp. 625-630.

Pirovano, "Scaling Analysis of Phase-Change Memory Technology", IEEE International Electron Devices Meeting, Dec. 2003, 5 pages.

List of IBM Patents or Patent Applications Treated as Related dated Jul. 28, 2022, 2 pages.

* cited by examiner

INTEGRATION OF SELECTOR ON CONFINED PHASE CHANGE MEMORY

BACKGROUND

The present invention generally relates to semiconductor devices, and more particularly to confined phase change memory devices and methods of forming the same.

A memory cell is a component of a computer memory device that includes an electronic circuit that stores one bit of binary information. One type of memory cell is a random-access memory (RAM) cell. Examples of RAM memory devices include, e.g., volatile memory devices and non-volatile memory devices. One example of a non-volatile memory is phase-change memory (PCM). PCM can exploit semiconducting properties of phase-change materials, such as, e.g., chalcogenide glass, that include amorphous and crystalline phases. Information can be stored in the amorphous and crystalline phases, which can be reversibly switched by applying an external voltage. Information can be read by measuring a resistance of the PCM cell. PCM technology can be used for electronic synapse devices, memristors for neuromorphic or analog computing, and high-density/high-speed non-volatile memory applications.

SUMMARY

In accordance with an embodiment of the present invention, a method for fabricating a semiconductor device is provided. The method includes forming air gaps within respective dielectric layer portions to reduce thermal cross-talk between adjacent bits. Each of the dielectric portions is formed on a substrate each adjacent to sidewall liners formed on sidewalls of a phase change memory (PCM) layer. The method further includes forming a pillar including the sidewall liners and the PCM layer, and forming a selector layer on the pillar and the dielectric portions.

In accordance with another embodiment of the present invention, a method for fabricating a semiconductor device is provided. The method includes forming at least two first dielectric portions on a substrate separated by a pore, forming sidewall liners along sidewalls of the first dielectric layer portions. The sidewall liners include a dielectric material formed on the sidewalls of the first dielectric portions and a conductive material formed on the dielectric material. The method further includes forming a phase change memory (PCM) layer in the pore such that the sidewall liners are disposed on sidewalls of the PCM layer, and forming at least two second dielectric layer portions on the substrate each adjacent to the sidewall liners. Forming the dielectric layer portions includes forming an air gap within each of the dielectric layer portions to reduce thermal cross-talk between adjacent bits. The method further includes forming a pillar including the sidewall liners and the PCM layer, and forming a selector layer on the pillar and the dielectric portions.

In accordance with yet another embodiment of the present invention, a semiconductor device is provided. The device includes a substrate, at least one lower electrode disposed within the substrate, and a pillar disposed on the lower electrode. The pillar includes a PCM layer and sidewall liners. The device further includes dielectric layer portions disposed on the substrate adjacent to the sidewall liners. Each of the dielectric layer portions including an air gap to reduce thermal cross-talk between adjacent bits. The device further includes a selector layer disposed on the pillar and the dielectric layer portions, and an upper electrode disposed on the selector layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Heat used for driving a change between states in phase change memory (PCM) material can propagate to adjacent materials and into adjacent memory cells, which can cause thermal cross-talk and errors in bit storage. Additionally, PCM cell designs can attempt to minimize the area of each cell in order to maximize the density of the memory arrays. As the density increases, neighboring PCM cells become closer and closer and heat propagation into adjacent memory cells become a concern.

The embodiments described herein provide for integration (e.g., noble integration) of selector material on a confined phase change memory (PCM) device (e.g., pillar-type PCM device) in a manner that can keep heat away from adjacent memory cells. The embodiments described herein can reduce issues associated with the scaling down of PCM device technology by providing fabrication of a PCM device with minimized etch damage, minimized thermal cross-talk between adjacent bits and/or resistance-drift mitigation for, e.g., multi-level switching and neuromorphic or analog computing. For example, the embodiments described herein can reduce the effects of local composition changes and defects on PCM and threshold switching material that can be caused by etch-induced damage. Additionally, PCM device formed in accordance with the embodiments described herein can include air gaps formed between pillars of the PCM device, which can reduce thermal cross-talk between adjacent bits.

Illustratively, the embodiments described herein can provide for an integration process for a one selector one resistor (1S1R) structure with a confined PCM device. The 1S1R structure can be used in the integration of three-dimensional (3D) cross-point structures. Accordingly, due to the minimized etching damage, low thermal cross-talk, mitigated resistance-drift and improved scalability, such a 1S1R structure in accordance with the embodiments described herein can be incorporated into high-density storage class memory (SCM).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
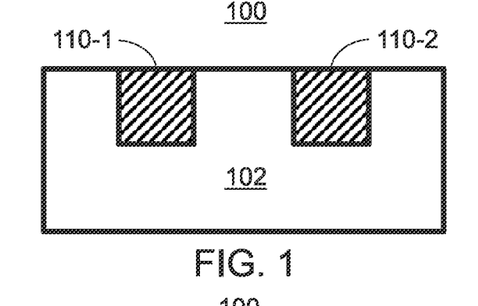
FIG. 1 is a cross-sectional view of the formation of lower electrodes of a phase change memory (PCM) device within a substrate during the fabrication of a semiconductor device, in accordance with an embodiment of the present invention.

Referring now to the drawings in which like numerals represent the same or similar elements and initially to FIG. 1, a cross-sectional view of a semiconductor device 100 is provided. In one embodiment, the device 100 includes a phase change memory (PCM) device. More specifically, the device 100 can include a confined PCM device. However, the device 100 can include any suitable memory device(s) in accordance with the embodiments described herein.

The device 100 includes a substrate 102 having multiple layers formed thereon. The substrate 102 can include any suitable substrate structure, e.g., a bulk semiconductor, a semiconductor-on-insulator (SOI) substrate, etc. The substrate 102 can include a dielectric material. In one embodiment, the substrate 102 can include silicon oxide ($SiO_2$). However, the substrate 102 can include any suitable material in accordance with the embodiments described herein.

As shown, lower electrodes 110-1 and 110-2 are formed within the substrate 102. The lower electrodes 110-1 and 110-2 can include any suitable conductive material in accordance with the embodiments described herein. Examples of suitable materials that the lower electrodes 110-1 and 110-2 can be formed from include, but are not limited to, gold (Au), silver (Ag), platinum (Pt), palladium (Pd), rhodium (Rh), iridium (Ir), ruthenium (Ru), osmium (Os), rhenium (Re), nickel (Ni), copper (Cu), zinc (Zn), cobalt (Co), iron (Fe), tungsten (W), molybdenum (Mo), tantalum (Ta), niobium (Nb), aluminum (Al), titanium (Ti), zirconium (Zr), polycrystalline silicon (Si), etc.

Figure 2:
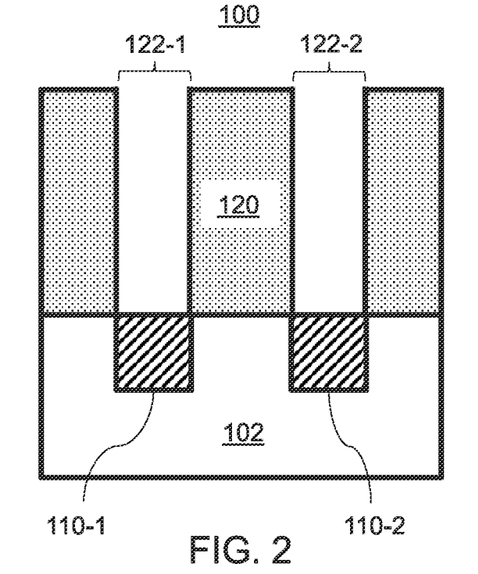
FIG. 2 is a cross-sectional view of the formation of first dielectric layer portions separated by pores during the fabrication of the semiconductor device, in accordance with an embodiment of the present invention.

With reference to FIG. 2, dielectric layer portions 120 separated by pores 122-1 and 122-2 are formed is formed on the substrate 102. The dielectric layer portions 120 can include any suitable dielectric material in accordance with the embodiments described herein. For example, the dielectric layer portions 120 can include, e.g., an oxide material. The dielectric layer portions 120 can be formed using any suitable process in accordance with the embodiments described herein. For example, a dielectric layer can be deposited on the substrate, and lithography can be used to form the dielectric portions 120 and the pores 122-1 and 122-2 from the dielectric layer.

The pores 122-1 and 122-2 can be formed to have an aspect ratio selected to promote air gap formation for reducing thermal cross-talk adjacent bits, as will be described in further detail below with reference to FIG. 8.

Figure 3:
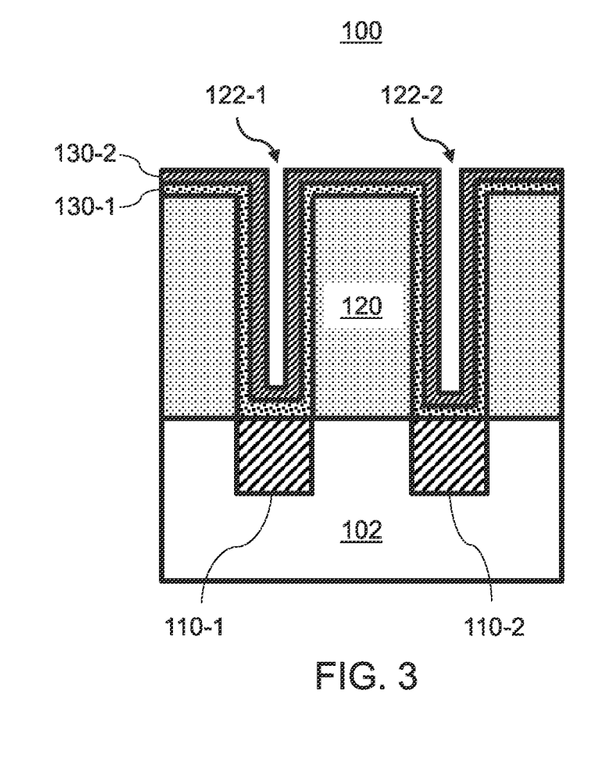
FIG. 3 is a cross-sectional view of the formation of liner material during the fabrication of the semiconductor device, in accordance with an embodiment of the present invention.

With reference to FIG. 3, liner material is formed on the dielectric layer portions 120 and the lower electrodes 110-1 and 110-2. As shown, the liner material can include layers 130-1 and 130-2 conformally deposited along exposed surfaces of the dielectric layer portions 120 and the lower electrodes 110-1 and 110-2. Any suitable process can be used to form the layers 130-1 and 130-2 in accordance with the embodiments described herein. For example, an atomic layer deposition (ALD) process can be used to form the liners 130-1 and 130-2. The ALD process can be used to provide continuity of the liners 130-1 and 130-2 when formed within the pores 122-1 and 122-2.

The layer 130-1 can include a dielectric material and the layer 130-2 can include a conductive material. The layers 130-1 and 130-2 can include any suitable materials in accordance with the embodiments described herein. For example, the layer 130-1 can include, e.g., a nitride material (e.g., SiN) and the layer 130-2 can include, e.g., a metal.

The thickness of the liner material has an inverse relationship with the volume of PCM material that will be formed within the pores 122-1 and 122-2. More specifically, if the liner is thicker, then the volume of PCM material will become smaller (and vice versa). Accordingly, the liner material can be formed to have a thickness that can function as a knob to adjust the volume of the pores 122-1 and 122-2.

As will be described in further detail with reference to FIG. 5, the material of the layer 130-2 can be chosen to enable substantially voidless dense formation of PCM material within the pores 122-1 and 122-2. The layer 130-2 can further mitigate resistance-drift. To that end, the device 100 can store multi-bits in a single cell, and can function as a multi-level cell (MLC) or analog synaptic devices. Examples of suitable materials that the layer 130-2 can be formed from include, but are not limited to, tantalum nitride (TaN), titanium nitride (TiN), etc.

Figure 4:
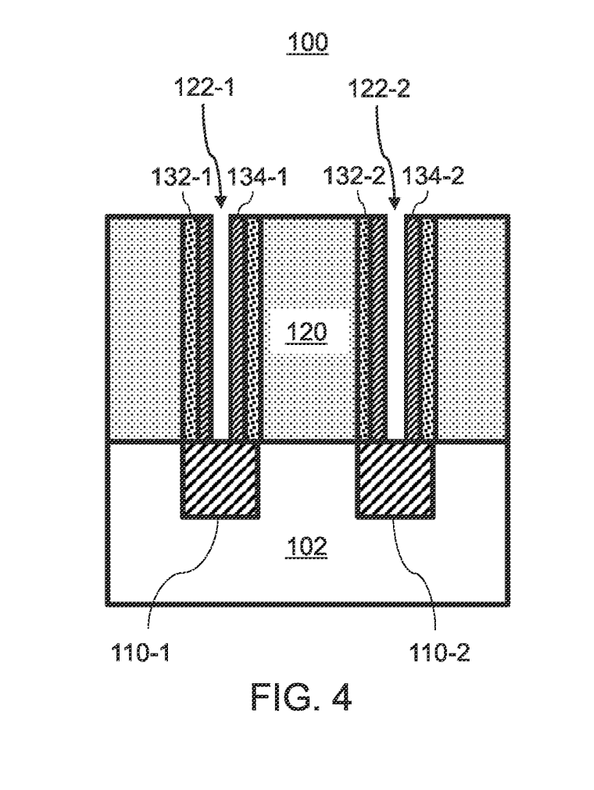
FIG. 4 is a cross-sectional view of the removal of portions of the liner material to form sidewalls along the pores during the fabrication of the semiconductor device, in accordance with an embodiment of the present invention.

With reference to FIG. 4, portions of the layers 130-1 and 130-2 are removed from the layers 130-1 and 130-2, respectively, to form a plurality of sidewall liners, including sidewall liners 132-1 and 134-1 along sidewalls of the dielectric layer portions 120 corresponding to the pore 122-1 and sidewall liners 132-2 and 134-2 along sidewalls of the dielectric layer portions 120 corresponding to the pore 122-2. More specifically, portions of the layers 130-1 and 130-2 in the field and near the lower electrodes 110-1 and 110-2 are removed prior to forming PCM material within the pores 122-1 and 122-2.

Figure 5:
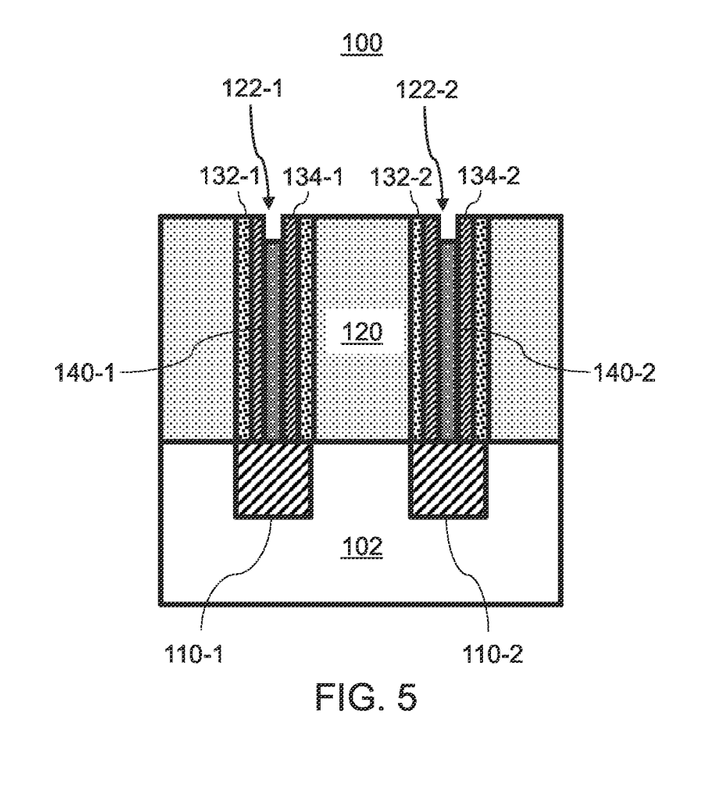
FIG. 5 is a cross-sectional view of the formation of phase change memory (PCM) layers to a height within the pores during the fabrication of the semiconductor device, in accordance with an embodiment of the present invention.

With reference to FIG. 5, PCM layers 140-1 and 140-2 are formed within the pores 122-1 and 122-2, respectively. As shown, the sidewall liners 134-1 and 134-2 are disposed on sidewalls of the PCM layer 140-1 and 140-2, respectively, and the sidewall liners 132-1 and 132-2 are disposed on sidewalls of the sidewall liners 134-1 and 134-2, respectively. Forming the PCM layers 140-1 and 140-2 can include depositing PCM material in the pores 122-1 and 122-2, removing portions of the PCM material in the field, and either planarizing (e.g., using chemical-mechanical planarization (CMP)) or etching back the PCM material to form the PCM layers 140-1 and 140-2. For example, due to the small size of the pores 122-1 and 122-2, the PCM material can be deposited in the pores 122-1 and 122-2 using ALD. As mentioned above, the material of the sidewall liners 134-1 and 134-2 can enable substantially voidless and dense PCM material deposition inside the pores 122-1 and 122-2.

The PCM material can generally be defined as any material which shows phase change caused by joule heating. The PCM material can be selectively settable to at least two states having different electrical resistivity. In a single-level cell (SLC), the PCM material can be programmable to one of two different resistance levels. For example, the phase change material can be a material selectively configurable to either a first phase having a first electrical resistance or a second phase having a second electrical resistance, where the first electrical resistance is greater than the second electrical resistance. In one embodiment, the PCM array is a multi-bit memory array. Accordingly, the PCM material can be programmed to one of at least three resistance levels for a multi-level cell (MLC).

For example, in one embodiment, the PCM layers 140-1 and 140-2 can each include a chalcogenide material. A chalcogenide material is a material formed from one or more chalcogens (e.g., sulfur (S), selenium (Se) and/or tellurium (Te). For example, the chalcogenide material can include a chalcogenide glass. Examples of suitable materials that the PCM layers 140-1 and 140-2 can be formed from include, but are not limited to, germanium-antimony-tellurium (GeSbTe) or GST, silver-indium-antimony-tellurium (AgInSbTe) or AIST, etc.

Figure 6:
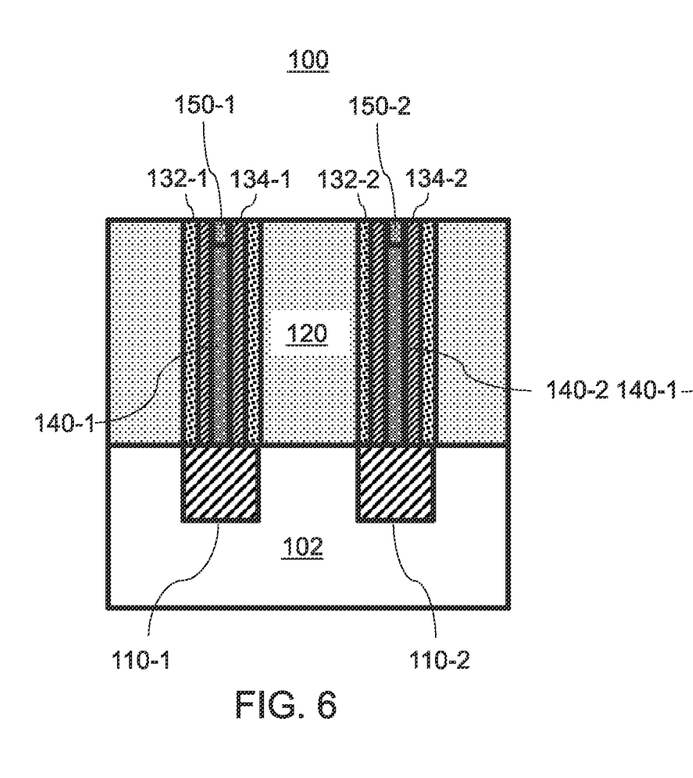
FIG. 6 is a cross-sectional view of the formation of protective layers on the PCM layers within the pores during the fabrication of the semiconductor device, in accordance with an embodiment of the present invention.

With reference to FIG. 6, protective layers 150-1 and 150-2 are formed on the PCM layers 140-1 and 140-2, respectively. The protective layers 150-1 and 150-2 protect the PCM layers 140-1 and 140-2 inside the pores 122-1 and 122-2 during subsequent processing performed to remove the dielectric layer portions 120, as will be described in further detail below with reference to FIG. 7.

Any suitable process can be used to form the protective layers 150-1 and 150-2 in accordance with the embodiments described herein. For example, the protective layers 150-1 and 150-2 can be formed by depositing and etching back a dielectric material. The protective layers 150-1 and 150-2 can be formed to include any suitable dielectric material in accordance with the embodiments described herein. For example, the protective layers 150-1 and 150-2 can include, e.g., a nitride material (e.g., SiN).

Figure 7:
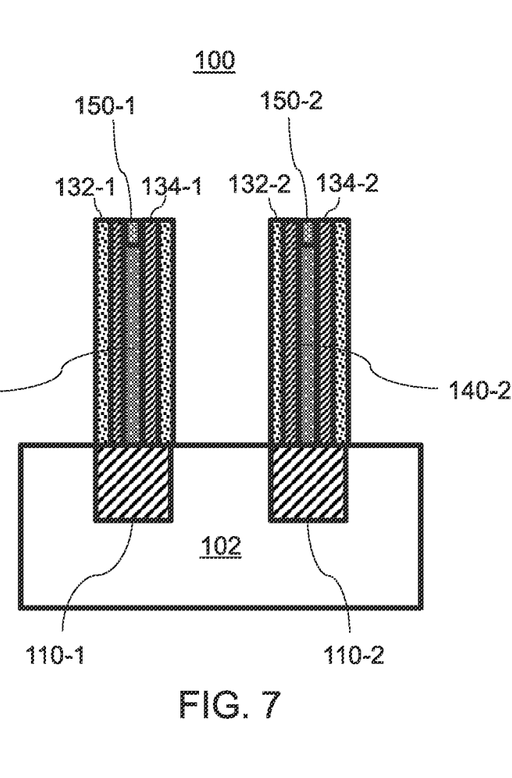
FIG. 7 is a cross-sectional view of the removal of the first dielectric layer portions during the fabrication of the semiconductor device, in accordance with an embodiment of the present invention.

With reference to FIG. 7, the dielectric layer portions 120 are removed. The dielectric layer portions 120 can be removed using any suitable etch process in accordance with the embodiments described herein. Due to the presence of the protective layers 150-1 and 150-2 on the PCM layers 140-1 and 140-2, the dielectric material of the dielectric layer portions 120 surrounding the pores 122-1 and 122-2 can be removed without damaging the PCM layers 140-1 and 140-2 inside of the pores 122-1 and 122-2.

Figure 8:
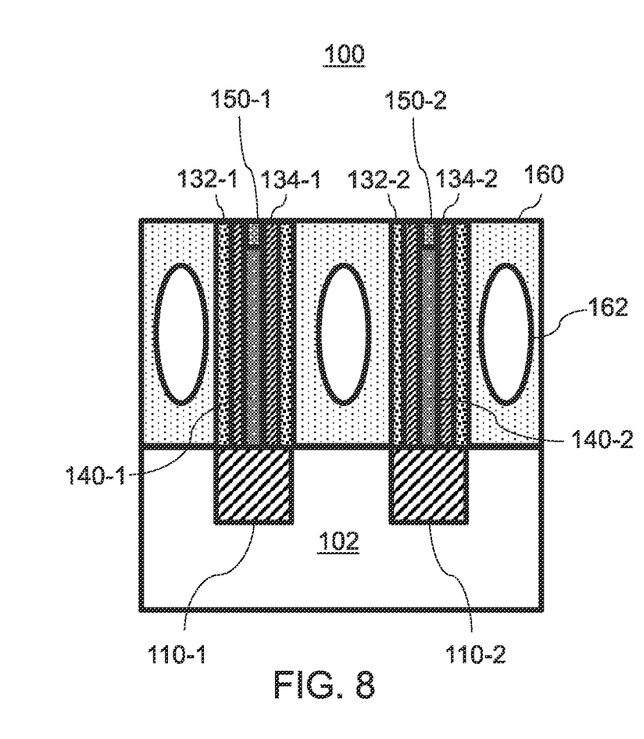
FIG. 8 is a cross-sectional view of the formation of second dielectric layer portions during the fabrication of the semiconductor device, in accordance with an embodiment of the present invention.

With reference to FIG. 8, dielectric layer portions 160 are formed on the substrate 102. The dielectric layer portions 160 can formed by depositing dielectric material on the substrate 102 within the gaps adjacent to the sidewall liners 132-1 and 132-2, and planarizing (e.g., using CMP) or etching back the material to make a flat surface. The dielectric layer portions 160 can be at the height of the protective layers 150-1 and 150-2. The dielectric material of the dielectric portions 160 can include, e.g., SiO$_2$. However, the dielectric portions 160 can include any suitable dielectric material in accordance with the embodiments described herein.

As shown, air gaps 162 can be formed within the dielectric material 160, which can reduce thermal cross-talk between adjacent bits. As described above with reference to FIG. 4, the air gaps 162 are formed as a result of the relatively high aspect ratio of the pores 122-1 and 122-2. More specifically, the aspect ratio is a function of the height of the layers within the pores (e.g., layers 132-1 and 134-1) and the distance between the layers formed within the pores (e.g., the distance between layers 134-1 and 132-2). Any suitable process can be used to form the dielectric layer portions 160 and the air gaps 162 in accordance with the embodiments described herein. For example, a physical vapor deposition (PVD) process can be used to deposit the dielectric material of the dielectric layer portions 160 such that the air gaps 162 can be formed within the PVD-deposited dielectric material.

Figure 9:
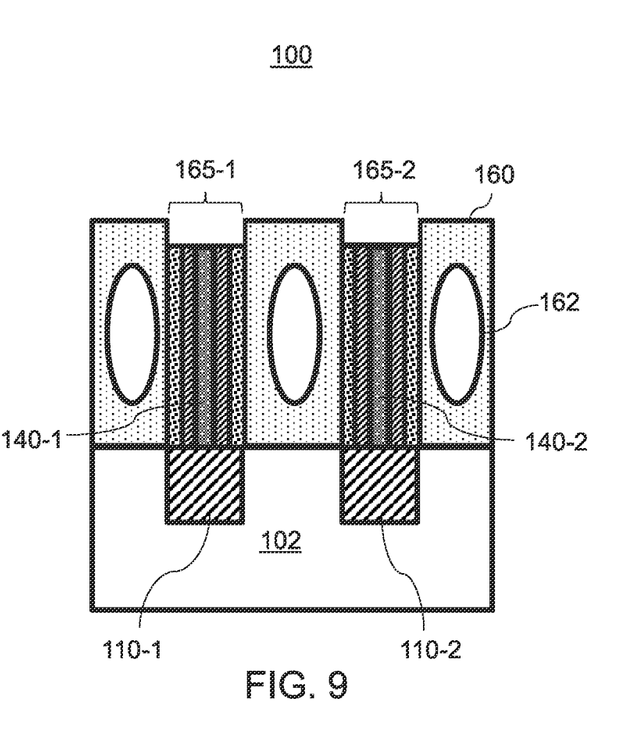
FIG. 9 is a cross-sectional view of the removal of the protective layers during the fabrication of the semiconductor device, in accordance with an embodiment of the present invention.

With reference to FIG. 9, the protective layers 150-1 and 150-2 are removed resulting in pillars 165-1 and 165-2. The protective layers 150-1 and 150-2 are removed in order to allow for connection of the pillars 165-1 and 165-2 with a selector layer, as described below with reference to FIG. 10. Any suitable etch process can be used to remove the protective layers 150-1 and 150-2 in accordance with the embodiments described herein.

Figure 10:
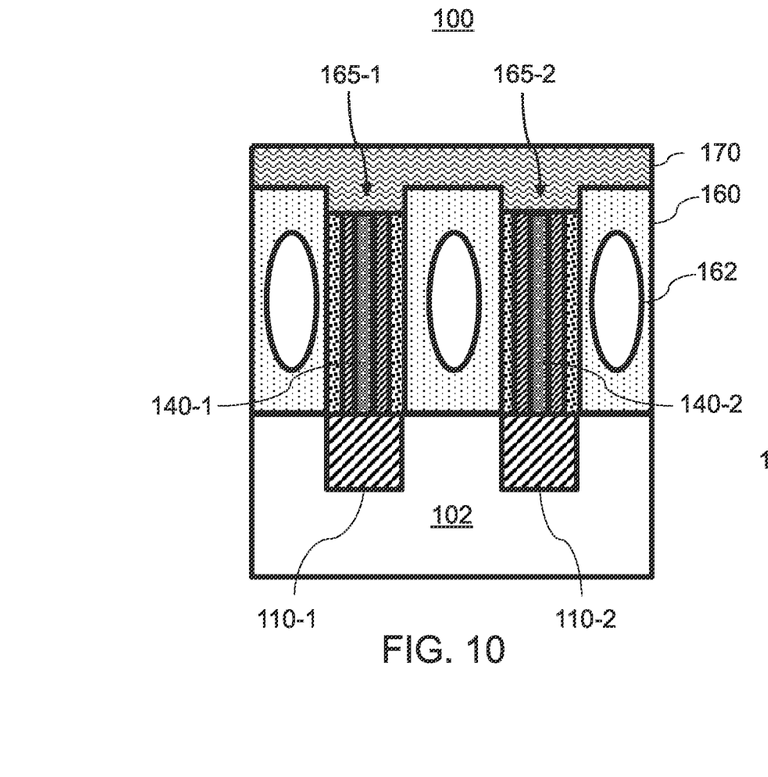
FIG. 10 is a cross-sectional view of the formation of selector material during the fabrication of the semiconductor device, in accordance with an embodiment of the present invention.

With reference to FIG. 10, a selector layer 170 associated with a selector device is formed on the pillars 165-1 and 165-2, and the dielectric layer portions 160. The selector layer 170 includes a selector material. The selector layer 170 need not be patterned, so that the selector material can be free from etch damage.

The selector device functions like a switching element directing current or voltage through a memory element coupled to the selector. More specifically, the selector material of the selector layer 170 can have a corresponding threshold voltage such that the selector material only conducts electricity when the threshold voltage/current is exceeded. That is, the state of the selector device changes when a voltage/current through the selector exceeds the threshold voltage/current. The selector device can prevent or minimize the impact of parallel resistance caused by parallel paths around a memory cell subject to access.

The selector layer 170 can include any suitable selector material in accordance with the embodiments described herein. More specifically, the selector layer 170 can include, e.g., an ovonic threshold switching (OTS) material. In one embodiment, the selector layer 170 can include a chalcogenide material formed from one or more chalcogens (e.g., sulfur (S), selenium (Se) and/or tellurium (Te)). For example, the chalcogenide material can include a chalcogenide glass. In one embodiment, the selector layer 170 includes an AsTeGeSiN-based material. It is contemplated that other selector devices, such as a bidirectional varistor, CRS, MIEC, and Schottky diode may be used in alternative embodiments.

Figure 11:
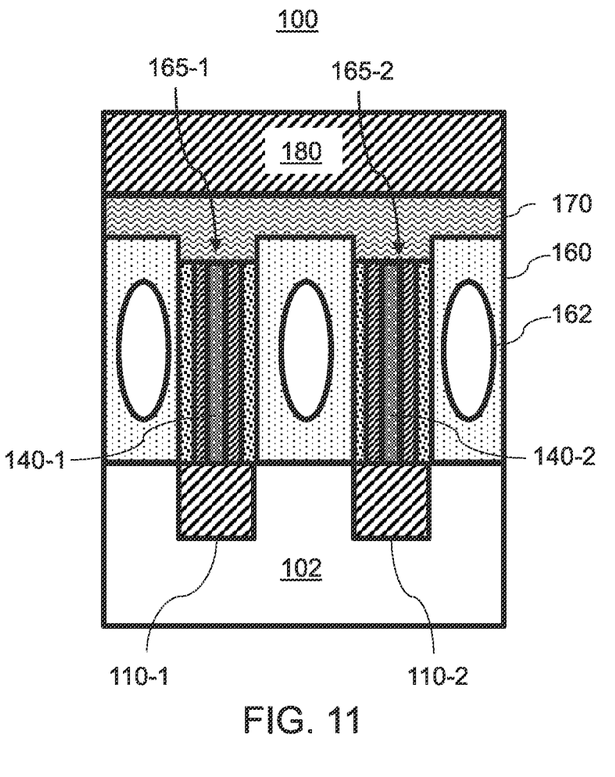
FIG. 11 is a cross-sectional view of the formation of an upper electrode of the PCM device on the selector material during the fabrication of the semiconductor device, in accordance with an embodiment of the present invention.

With reference to FIG. 11, an upper electrode 180 is formed on the selector layer 170. The upper electrode 180 can include any suitable material in accordance with the embodiments described herein. Examples of suitable materials that the upper electrode 180 can be formed from include, but are not limited to, gold (Au), silver (Ag), platinum (Pt), palladium (Pd), rhodium (Rh), iridium (Jr), ruthenium (Ru), osmium (Os), rhenium (Re), nickel (Ni), copper (Cu), zinc (Zn), cobalt (Co), iron (Fe), tungsten (W), molybdenum (Mo), tantalum (Ta), niobium (Nb), aluminum (Al), titanium (Ti), zirconium (Zr), polycrystalline silicon (Si), etc.

Figure 12:
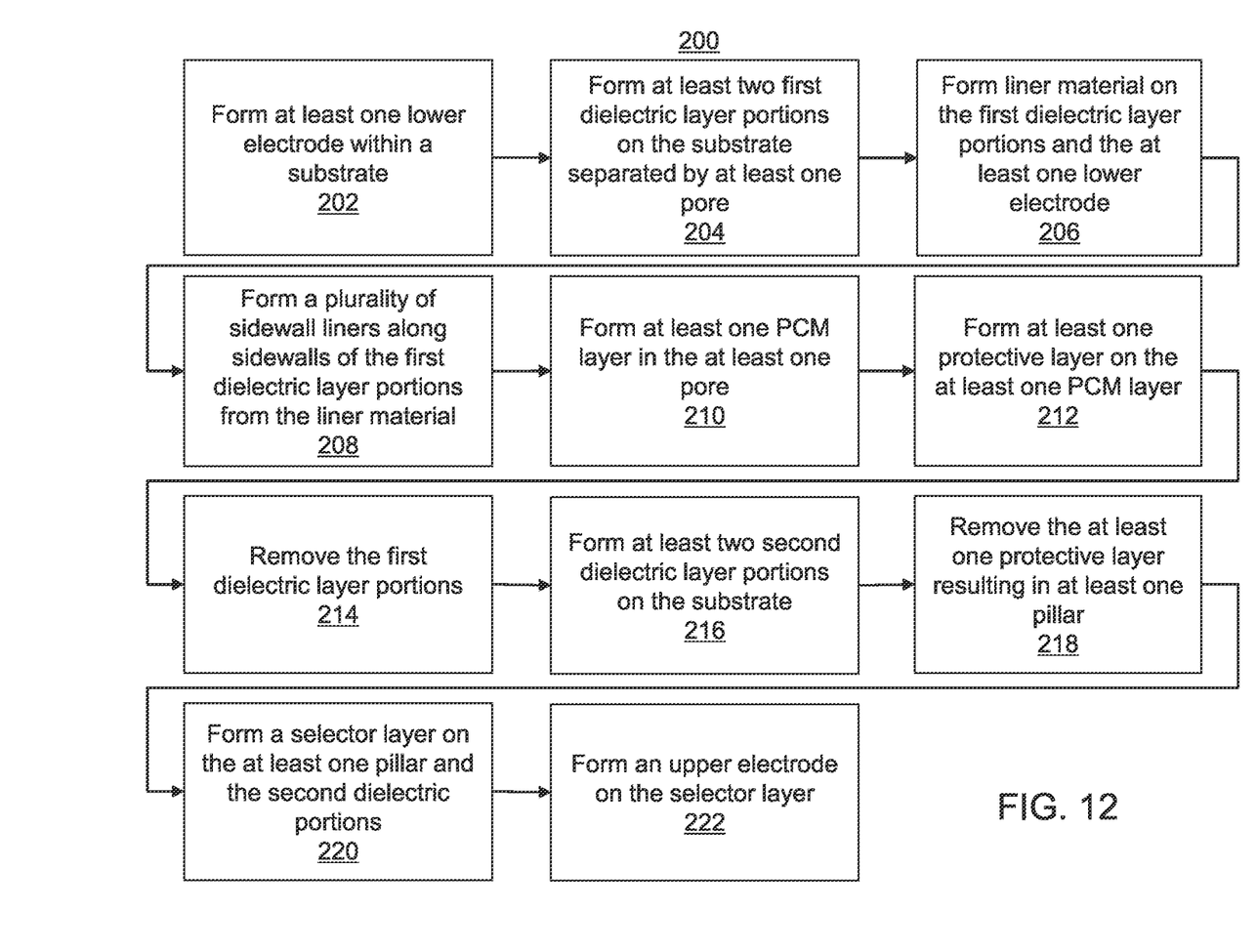
FIG. 12 is a block/flow diagram illustrating a system/method for fabricating a semiconductor device, in accordance with an embodiment of the present invention.

With reference to FIG. 12, a block/flow diagram is shown illustrating a system/method 200 for fabricating a semiconductor device. Further details regarding the system/method of FIG. 12 are described above with reference to FIGS. 1-11.

At block 202, at least one lower electrode is formed within a substrate. In one embodiment, the substrate includes a dielectric material. The substrate can include any suitable dielectric material, and the lower electrodes can be formed to include any suitable conductive material in accordance with the embodiments described herein.

At block 204, at least two first dielectric layer portions are formed on the substrate separated by at least one pore. Forming the first dielectric layer portions can include depositing a first dielectric material on the substrate, and using lithography to form the at least one pore within the first dielectric material resulting in the first dielectric layer portions.

The at least one pore can be formed to have an aspect ratio selected to promote air gap formation for reducing thermal cross-talk between adjacent bits. For example, the at least one pore can be formed to have a suitably high aspect ratio conducive to the formation of air gaps.

At block 206, liner material is formed on the first dielectric layer portions and the at least one lower electrode. The liner material can include a dielectric material conformally deposited along exposed surfaces of the first dielectric layer portions and the at least one lower electrode, and a conductive material conformally deposited along the dielectric material. Any suitable process can be used to form the liner material in accordance with the embodiments described herein. For example, an atomic layer deposition (ALD) process can be used to form the liner material. The ALD process can be used to provide continuity of the liner material when formed within the at least one pore The liner material can be formed to include any suitable materials in accordance with the embodiments described herein. For example, the dielectric material can include, e.g., a nitride material (e.g., SiN) and the conductive material can include, e.g., a metal. As mentioned above, the dielectric material can be formed to have a thickness that functions as a "knob" to adjust the volume of the at least one pore. The conductive material can be chosen to enable substantially voidless dense formation of phase change memory (PCM) material within the at least one pore. Examples of suitable materials that the conductive material can be formed from include, but are not limited to, tantalum nitride (TaN), titanium nitride (TiN), etc.

At block 208, a plurality of sidewall liners are formed along sidewalls of the first dielectric layer portions from the liner material. More specifically, portions of the dielectric and conductive materials in the field and near the at least one lower electrode can be removed.

At block 210, at least one PCM layer is formed in the at least one pore. The at least one PCM layer is formed such that the sidewall liners are disposed on sidewalls of the PCM layer. More specifically, the at least one PCM layer is formed such that conductive material is disposed on sidewalls of the at least one PCM layer, and the dielectric material is disposed on the conductive material.

Forming the at least one PCM layer can include depositing PCM material in the at least one pore, removing portions of the PCM material in the field, and either planarizing (e.g., using chemical-mechanical planarization (CMP)) or etching back the PCM material to form the at least one PCM layer. For example, due to the size of the at least one pore, the PCM material can be deposited in the at least one pore using ALD. As mentioned above, the material of the sidewall liners can enable substantially voidless and dense PCM material deposition inside the at least one pore. The at least one PCM layer can be formed to include a chalcogenide material.

At block 212, at least one protective layer is formed on the at least one PCM layer. The at least one protective layer can protect the at least one PCM layer during subsequent processing performed to remove the first dielectric portions. Any suitable process can be used to form the at least one protective layer in accordance with the embodiments described herein. For example, the at least one protective layer can be formed by depositing and etching back a dielectric material. The at least one protective layer can be formed to include any suitable dielectric material in accordance with the embodiments described herein. For example, the at least one protective layer can include, e.g., a nitride material (e.g., SiN).

At block 214, the first dielectric layer portions are removed. The first dielectric layer portions can be removed using any suitable etch process in accordance with the embodiments described herein. Due to the presence of the at least one protective layer on the at least one PCM layer, the dielectric material of the first dielectric layer portions surrounding the at least one pore can be removed without damaging the at least one PCM layer.

At block 216, at least two second dielectric layer portions are formed on the substrate. The second dielectric layer portions can formed by depositing dielectric material on the substrate within the gaps adjacent to the sidewall liners, and planarizing (e.g., using CMP) or etching back the dielectric material to make a flat surface. The second dielectric layer portions can be formed to be at the height of the at least one protective layer.

Forming the second dielectric layer portions further includes forming an air gap within each of the second dielectric layer portions. As described above, the air gaps are formed as a result of the aspect ratio of the at least one pore. The air gaps are formed to reduce thermal cross-talk between adjacent bits. Any suitable process can be used to form the second dielectric layer portions and the air gaps in accordance with the embodiments described herein. For example, a physical vapor deposition (PVD) process can be used to deposit the dielectric material of the second dielectric layer portions such that the air gaps are formed within the PVD-deposited dielectric material.

At block 218, the at least one protective layer is removed resulting in at least one pillar. The at least one protective layer is removed in order to allow for connection of the at least one pillar with a selector layer. Any suitable etch process can be used to remove the at least one protective layer in accordance with the embodiments described herein.

At block 220, a selector layer is formed on the at least one pillar and the second dielectric layer portions. The selector layer is associated with a selector for selecting a memory cell in the memory device. The selector layer need not be patterned, so that the selector material can be free from etch damage. The selector layer can include any suitable selector material in accordance with the embodiments described herein. More specifically, the selector layer can include, e.g., an ovonic threshold switching (OTS) material. In one embodiment, the selector layer can include a chalcogenide material formed from one or more chalcogens (e.g., sulfur (S), selenium (Se) and/or tellurium (Te)). For example, the chalcogenide material can include a chalcogenide glass. In one embodiment, the selector layer can include, e.g., an AsTeGeSiN-based material.

At block 222, an upper electrode is formed on the selector layer. The upper electrode can include any suitable material in accordance with the embodiments described herein.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims.

Having thus described aspects of the invention, with the details and particularity required by the patent laws, what is claimed and desired protected by Letters Patent is set forth in the appended claims.

What is claimed is:

1. A semiconductor device comprising:
   a substrate;
   at least one lower electrode disposed within the substrate;
   a pillar disposed on the lower electrode, the pillar including a PCM layer and sidewall liners;
   dielectric layer portions disposed on the substrate adjacent to the sidewall liners, each of the dielectric layer portions including an air gap to reduce thermal crosstalk between adjacent bits, wherein an upper surface of the pillar that is opposite a side of the pillar that is closest to the substrate is vertically offset from the upper surface of the dielectric layer portions;
   a selector layer directly disposed on the pillar and the dielectric layer portions, the selector layer having a stepped interface that is conformal with the vertically offset upper surface of the pillars and the uppers surface of the dielectric layer portions; and
   an upper electrode disposed on the selector layer.

2. The device of claim 1, wherein the sidewall liners include a conductive material disposed on the pillar and a dielectric material disposed on the conductive material.

3. The device of claim 2, wherein the selector layer includes an AsTeGeSiN-based material.

4. The device of claim 1, wherein the PCM layer comprises a chalcogenide material.

5. The device of claim 1, wherein the PCM layer has a composition selected from the group consisting of germanium antimony tellurium (GeSbTe), silver indium antimony tellurium (AgInSbTe) and combinations thereof.

6. The device of claim 1, wherein the dielectric layer portions comprise silicon dioxide.

* * * * *